(12) United States Patent
Kawasaki et al.

(10) Patent No.: US 10,888,957 B2
(45) Date of Patent: Jan. 12, 2021

(54) SOLDERING MATERIAL

(71) Applicant: Senju Metal Industry Co., Ltd., Tokyo (JP)

(72) Inventors: Hiroyoshi Kawasaki, Tokyo (JP); Tomoaki Nishino, Tokyo (JP); Takahiro Roppongi, Tochigi (JP); Isamu Sato, Saitama (JP); Yuji Kawamata, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/740,484

(22) PCT Filed: Jun. 23, 2016

(86) PCT No.: PCT/JP2016/068673
§ 371 (c)(1),
(2) Date: May 21, 2018

(87) PCT Pub. No.: WO2017/002704
PCT Pub. Date: Jan. 5, 2017

(65) Prior Publication Data
US 2018/0281118 A1 Oct. 4, 2018

(30) Foreign Application Priority Data
Jun. 29, 2015 (JP) .................. 2015-129649

(51) Int. Cl.
*B32B 15/01* (2006.01)
*B32B 15/04* (2006.01)
(Continued)

(52) U.S. Cl.
CPC ............ *B23K 35/0244* (2013.01); *B22F 1/00* (2013.01); *B22F 1/0048* (2013.01);
(Continued)

(58) Field of Classification Search
CPC ........ B22F 1/00; B22F 1/0048; B22F 1/0085; B22F 1/025; B22F 1/02; B22F 1/0062;
(Continued)

(56) References Cited

U.S. PATENT DOCUMENTS

2010/0018748 A1* 1/2010 Aoyama ......... H01L 31/022425
174/126.2
2011/0220196 A1 9/2011 Nishi et al.
(Continued)

FOREIGN PATENT DOCUMENTS

| CN | 102166691 A | 8/2011 |
| CN | 103831543 A | 6/2014 |

(Continued)

OTHER PUBLICATIONS

Machine Translation, Nishimura et al., JP 2011-029395, Feb. 2011.*
(Continued)

*Primary Examiner* — Michael E. La Villa
(74) *Attorney, Agent, or Firm* — The Webb Law Firm (57) ABSTRACT

The present invention accurately distinguishes a soldering material less likely to oxidize. A Cu core ball has a Cu ball having a predetermined size, and a solder layer coating the Cu ball. The Cu ball provides a space between a semiconductor package and a printed circuit board. The Cu core ball has the soldering material having lightness greater than or equal to 62.5 in L*a*b* color space subsequent to a heating storage test performed for 72 hours in a temperature-controlled bath at 150° C. with a temperature of 25° C. and 40% humidity, and the soldering material, prior to the heating storage test, having lightness greater than or equal to 65 in the L*a*b* color space and yellowness less than or equal to 7.0 in the L*a*b* color space.

7 Claims, 3 Drawing Sheets

(51) Int. Cl.
| | |
|---|---|
| *H01L 23/00* | (2006.01) |
| *H01L 23/498* | (2006.01) |
| *B23K 35/02* | (2006.01) |
| *B23K 35/26* | (2006.01) |
| *B23K 35/30* | (2006.01) |
| *B23K 35/365* | (2006.01) |
| *B23K 35/36* | (2006.01) |
| *G01N 21/95* | (2006.01) |
| *B22F 1/02* | (2006.01) |
| *B22F 1/00* | (2006.01) |
| *G01N 21/956* | (2006.01) |
| *G01N 21/25* | (2006.01) |
| *H05K 3/34* | (2006.01) |
| *C23C 30/00* | (2006.01) |
| *C23C 28/02* | (2006.01) |
| *C22C 13/00* | (2006.01) |

(52) U.S. Cl.
CPC .......... *B22F 1/0062* (2013.01); *B22F 1/0085* (2013.01); *B22F 1/02* (2013.01); *B22F 1/025* (2013.01); *B23K 35/025* (2013.01); *B23K 35/0227* (2013.01); *B23K 35/0238* (2013.01); *B23K 35/262* (2013.01); *B23K 35/302* (2013.01); *B23K 35/3033* (2013.01); *B23K 35/3046* (2013.01); *B23K 35/3602* (2013.01); *B23K 35/365* (2013.01); *B32B 15/01* (2013.01); *B32B 15/04* (2013.01); *B32B 15/043* (2013.01); *C23C 28/02* (2013.01); *C23C 28/021* (2013.01); *C23C 28/023* (2013.01); *C23C 30/00* (2013.01); *C23C 30/005* (2013.01); *G01N 21/25* (2013.01); *G01N 21/951* (2013.01); *G01N 21/95684* (2013.01); *H01L 23/49816* (2013.01); *H01L 24/11* (2013.01); *H01L 24/13* (2013.01); *H05K 3/34* (2013.01); *B22F 2999/00* (2013.01); *C22C 13/00* (2013.01); *G01N 2021/95646* (2013.01); *H01L 24/16* (2013.01); *H01L 24/81* (2013.01); *H01L 2224/13016* (2013.01); *H01L 2224/13582* (2013.01); *H01L 2224/13611* (2013.01); *H01L 2224/13655* (2013.01); *H01L 2224/13657* (2013.01); *H01L 2224/16227* (2013.01); *H01L 2224/81815* (2013.01); *H01L 2924/15311* (2013.01); *H01L 2924/20105* (2013.01); *H01L 2924/37001* (2013.01); *Y10T 428/12222* (2015.01); *Y10T 428/12229* (2015.01); *Y10T 428/12493* (2015.01); *Y10T 428/12708* (2015.01); *Y10T 428/12715* (2015.01); *Y10T 428/12722* (2015.01); *Y10T 428/12931* (2015.01); *Y10T 428/12937* (2015.01); *Y10T 428/12944* (2015.01); *Y10T 428/12993* (2015.01)

(58) Field of Classification Search
CPC .. B22F 2201/05; B22F 2999/00; H01L 24/13; H01L 24/11; H01L 24/16; H01L 24/81; H01L 2924/15311; H01L 2924/20105; H01L 2924/37001; H01L 23/49816; H01L 2224/13657; H01L 2224/13655; H01L 2224/13611; H01L 2224/13582; H01L 2224/13016; H01L 2224/16227; H01L 2224/81815; C22C 13/00; C23C 28/02; C23C 28/021; C23C 28/023; C23C 30/00; C23C 30/005; B32B 15/01; B32B 15/04; B32B 15/043; B23K 35/365; B23K 35/3602; B23K 35/302; B23K 35/262; B23K 35/025; B23K 35/0244; B23K 35/3033; B23K 35/3046; B23K 35/0227; B23K 35/0238; G01N 21/951; G01N 21/95684; G01N 2021/95646; G01N 21/25; Y10T 428/12222; Y10T 428/12229; Y10T 428/12493; Y10T 428/12708; Y10T 428/12715; Y10T 428/12722; Y10T 428/12931; Y10T 428/12937; Y10T 428/12944; Y10T 428/12993; H05K 3/34; C25D 5/00

See application file for complete search history.

(56) References Cited

U.S. PATENT DOCUMENTS

| | | |
|---|---|---|
| 2013/0171472 A1 | 7/2013 | Takeda et al. |
| 2013/0333929 A1 | 12/2013 | Ogawa et al. |
| 2015/0209912 A1 | 7/2015 | Kawaskaki et al. |
| 2015/0336216 A1 | 11/2015 | Hattori et al. |
| 2017/0312860 A1* | 11/2017 | Hattori ............... B22F 1/00 |

FOREIGN PATENT DOCUMENTS

| | | | |
|---|---|---|---|
| EP | 1785498 A2 | | 5/2007 |
| EP | 3216553 A1 | | 9/2017 |
| JP | 2009248156 A | | 10/2009 |
| JP | 2011-029395 | * | 2/2011 |
| JP | 5585751 B1 | | 9/2014 |
| JP | 5590259 B1 | | 9/2014 |
| JP | 5652560 B1 | | 1/2015 |
| JP | WO 2016/071971 | * | 5/2016 |
| JP | 2017-113756 | * | 6/2017 |
| TW | 201219581 A1 | | 5/2012 |
| WO | 9524113 A1 | | 9/1995 |
| WO | 2009090776 A1 | | 7/2009 |
| WO | 2012118202 A1 | | 9/2012 |
| WO | 2014109052 A1 | | 7/2014 |

OTHER PUBLICATIONS

Machine Translation, Takeda et al., JP 2017-113756, Jun. 2017. (Year: 2017).*

Machine Translation, Takashi, JP 2017-113756, Jun. 2017. (Year: 2017).*

* cited by examiner

SOLDERING MATERIAL

CROSS-REFERENCE TO RELATED APPLICATIONS

This application is the United States national phase of International Application No. PCT/JP2016/068673 filed Jun. 23, 2016, and claims priority to Japanese Patent Application No. 2015-129649 filed Jun. 29, 2015, the disclosures of which are hereby incorporated in their entirety by reference.

TECHNICAL FIELD

This invention relates to a soldering material, a solder joint, and a soldering material inspecting method.

BACKGROUND

In tandem with the development of compact information appliances in recent years, there is a rapid ongoing progress in miniaturization of electronic components to be mounted on such appliances. The technique called, ball grid array (hereinafter, "BGA") with an electrode-mounted back surface, may be applied to the electronic components to fulfill the needs for miniaturization, for example, smaller connection terminals and narrower-pitched mounting area.

Examples of the BGA-applied electronic components may include semiconductor packages. For example, the semiconductor package may have a structure in which electrode-mounted semiconductor chips are joined with solder bumps to the conductive land of a printed circuit board and then sealed in resin. In recent years, a three-dimensional high-density mounting has been developed by stacking up the semiconductor packages in a height direction in order to meet the further high-density mounting requirement.

Examples of the solder bumps so far developed may include Cu core balls. Patent Document 1 describes a Cu core ball including a Cu ball as its core and a solder layer coating the Cu ball's surface. The solder bump formed by using the Cu core ball can support a semiconductor package by the Cu ball, which is not melted at a melting temperature of the solder, even if the solder bump receives the weight of the semiconductor package when the electronic components are mounted on the printed circuit board. Therefore, it can be prevented that the solder bump is crushed by the semiconductor package's weight.

By the way, there is an occasion when an oxide film is formed on a solder surface of the Cu core ball. By this influence of the oxide film, wettability defects occur between the solder and an electrode. As the result, a mounting failure of the Cu core ball occurs, and therefore a problem that the productivity or yield ratio of the semiconductor package is significantly decreased arises. Accordingly, the Cu core ball should desirably be resistant to oxidation.

There is also an occasion when a problem of oxide film of the Cu core ball arises due to the temperature or humidity of the storage environment of the Cu core ball after being manufactured. Even in a case where a reflow treatment is conducted after mounting a Cu core ball having an oxide film formed on the electrodes of the semiconductor package, wettability defects of solder occurs similarly, and the solder constituting the Cu core ball does not wetly spread across the entire electrode. Accordingly, there is a problem that a mounting failure of the Cu core ball occurs because of the electrode exposure, misaligned Cu core ball toward the electrodes or the like. Therefore, the management of oxide film thickness after manufacturing Cu core balls is also an important problem.

The inventors of this application focused on two indexes; yellowness and lightness, for the management of oxide film thickness before the solder starts to melt. Then, the inventors have suggested that the thickness of the oxide film formed on the surface of the Cu core ball can be managed accurately, by selecting any Cu core ball having yellowness and lightness that respectively fall within ranges of preset values. By using Cu core balls obtained by the management of oxide film thickness, semiconductor chips may be effectively joined to a printed circuit board.

PRIOR ART DOCUMENTS

Patent Documents

Patent Document 1; International Patent Publication No. 95/24113

SUMMARY OF THE INVENTION

Problems to be Solved by the Invention

Conventionally, a plating treatment performed on the Cu ball is followed by cleaning to remove residue of a plating solution, for example, components of the plating solution left on the surface of the Cu core ball. Examples of the residue may include organic complexing agent, pH regulator, pH buffer, accelerator, stabilizer, surface active agent, brightening agent, semi-brightening agent, and lubricating agent. However, even for the Cu core ball having yellowness and lightness that respectively fall within ranges of preset values after manufacturing, in case the cleaning is insufficient, the plating solution residue may be left in rather abundance on the surface of the Cu core ball. Then, long-term storage, even if optimally conditioned, may accelerate more than usual the solder's oxidation on the surface of the Cu core ball depending on the amount of residue. As a result, this may occur with any Cu core balls having yellowness and lightness that respectively fall within ranges of preset values after the manufacture. The yellowness and lightness of a manufactured Cu core ball selected and used may meet the preset numerical ranges. Yet, the oxide film is still possibly formed on the surface of this Cu core ball, which may result in bonding failure at the time of joining a semiconductor chip to a printed circuit board.

To solve these above-mentioned problems, this invention is made and has an object to provide a soldering material less likely to oxidize after long-term storage, and a solder joint using the same. This invention is further directed to providing a soldering material inspecting method for accurately identifying a soldering material less likely to oxidize after long-term storage.

Means for Solving the Problems

The inventors have found that, when lightness (L*value) in the L*a*b* color space subsequent to a heating storage test is greater than or equal to 62.5 in a Cu core ball cleaned and then heated at a predetermined temperature and with atmospheric humidity to purposely accelerate the oxidation, the Cu core ball may have a reduced amount of the plating solution residue, i.e., the Cu core ball may be less likely to oxidize. The heating storage test described herein refers to as a test performed to purposely accelerate the growth of an oxide film on a Cu core ball formed in accordance with the amount of plating solution residue after cleaning of the Cu core ball 1. In this test, the formed Cu core ball may be, for example, heated and stored for 72 hours in a temperature-controlled bath at 150° C. in a room with a temperature of 25° C. and 40% humidity. Some of the Cu core balls manufactured may be subjected to an acceleration test or the like.

(1) This invention provides a soldering material including: a core that provides a space between a joining object and an object to be joined; and a covering layer coating the core and including Sn or a solder alloy primarily including Sn. The soldering material has lightness greater than or equal to 62.5 in L*a*b* color space subsequent to a heating storage test performed for 72 hours in a temperature-controlled bath at 150° C. set in a room with a temperature of 25° C. and 40% humidity. The soldering material prior to the heating storage test has lightness greater than or equal to 65 in the L*a*b* color space and yellowness less than or equal to 7.0 in the L*a*b* color space.

(2) The soldering material recited in the above-mentioned item (1) may be further characterized in that the core is coated with a layer including one or more elements selected from the group consisting of Ni and Co, and is then coated with the solder layer.

(3) The soldering material recited in the above-mentioned item (1) or (2) may be further characterized in that the lightness of the soldering material in the L*a*b* color space subsequent to the heating storage test is greater than or equal to 70.2.

(4) The soldering material recited in any one of the above-mentioned items (1) through (3) may be further characterized in that the core is a spherical material made of at least one element selected from the group consisting of Cu, Ni, Ag, Bi, Pb, Al, Sn, Fe, Zn, In, Ge, Sb, Co, Mn, Au, Si, Pt, Cr, La, Mo, Nb, Pd, Ti, Zr, and Mg, or a resin material.

(5) The soldering material recited in any one of the above-mentioned items (1) through (3) may be further characterized in that the core is a cylindrical material made of at least one element selected from the group consisting of Cu, Ni, Ag, Bi, Pb, Al, Sn, Fe, Zn, In, Ge, Sb, Co, Mn, Au, Si, Pt, Cr, La, Mo, Nb, Pd, Ti, Zr, and Mg, or a resin material.

(6) A solder joint using any one of the soldering materials recited in any one of the above-mentioned items (1) through (5).

(7) This invention further provides a soldering material including: a core that provides a space between a joining object and an object to be joined; and a covering layer coating the core and including Sn or a solder alloy primarily including Sn. In this soldering material, an oxide film thickness is less than or equal to 4.9 nm subsequent to heating for 72 hours in a temperature-controlled bath at 150° C. set in a room with a temperature of 25° C. and 40% humidity.

(8) The soldering material recited in the above-mentioned item (7) may be further characterized in that the core is coated with a layer including one or more elements selected from the group consisting of Ni and Co, and is then coated with the solder layer.

(9) The soldering material recited in the above-mentioned item (7) or (8) may be further characterized in that the oxide film thickness is less than or equal to 3.1 nm subsequent to the heating storage test.

(10) The soldering material recited in any one of the above-mentioned items (7) through (9) may be further characterized in that the core is a spherical material made of at least one element selected from the group consisting of Cu, Ni, Ag, Bi, Pb, Al, Sn, Fe, Zn, In, Ge, Sb, Co, Mn, Au, Si, Pt, Cr, La, Mo, Nb, Pd, Ti, Zr, and Mg, or a resin material.

(11) The soldering material recited in any one of the above-mentioned items (7) through (9) may be further characterized in that the core is a cylindrical material made of at least one element selected from the group consisting of Cu, Ni, Ag, Bi, Pb, Al, Sn, Fe, Zn, In, Ge, Sb, Co, Mn, Au, Si, Pt, Cr, La, Mo, Nb, Pd, Ti, Zr, and Mg, or a resin material.

(12) A solder joint using any one of the soldering materials recited in any one of the above-mentioned items (7) through (11).

(13) This invention further provides a soldering material inspecting method, including steps of heating a soldering material for 72 hours in a temperature-controlled bath at 150° C. set in a room with a temperature of 25° C. and 40% humidity, the soldering material including a core that provides a space between a joining object and object to be joined, and a covering layer coating the core and including Sn or a solder alloy primarily including Sn; and obtaining the soldering material having lightness greater than or equal to 62.5 in L*a*b* color space subsequent to the heating step.

Effects of the Invention

The soldering material, solder joint, and soldering material inspecting method according to this invention may allow Cu core balls less likely to oxidize after long-term storage to be accurately identified in a short time.

EMBODIMENT FOR CARRYING OUT THE INVENTION

A preferred embodiment of this disclosure is hereinafter described in detail referring to the accompanying drawings. The terms, lightness and yellowness, hereinafter described refer to the L*a*b* color space.

[Cu Core Ball]

Figure 1:
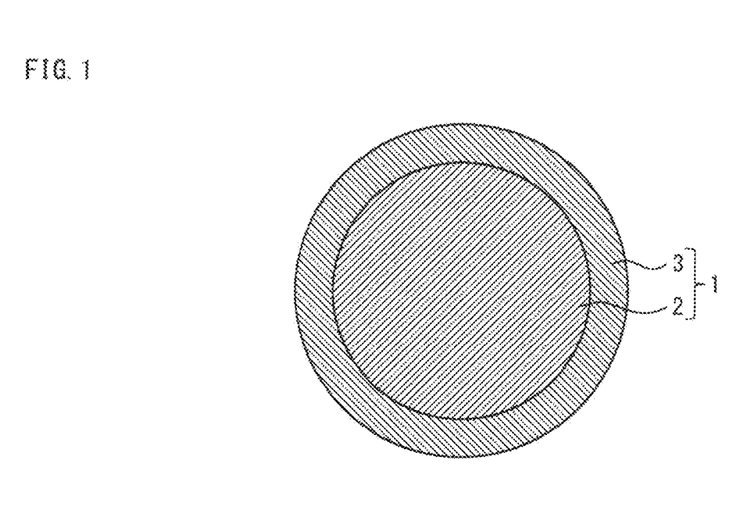
FIG. 1 is a cross-sectional view of a Cu core ball according to an embodiment of the present invention for showing a configuration example thereof.

FIG. 1 is a cross-sectional view of a Cu core ball 1 according to an embodiment of this invention for showing a configuration example thereof. As illustrated in FIG. 1, the Cu core ball 1 according to this invention includes a Cu ball (core) 2 having a predetermined size, and a solder layer (covering layer) 3 coating the Cu ball 2. The Cu ball 2 provides a space between a semiconductor package (joining object) and a printed circuit board (object to be joined).

Cu Core Ball 1: Lightness and Yellowness Prior to Heating Storage Test

The Cu core ball 1 according to this invention has, prior to a heating storage test, lightness greater than or equal to 65 in the L*a*b* color space and yellowness less than or equal to 7.0 in the L*a*b* color space. By selecting the Cu core ball 1 having lightness and yellowness meeting these numerical ranges, a thickness of an oxide film formed on a surface of the solder layer 3A can be managed so as to be a fixed value or less.

In this invention, prior to the heating storage test, the thickness of the oxide film on the Cu core ball 1 is managed by both indexes of the yellowness and lightness, because the thickness of the oxide film on the Cu core ball 1 cannot be managed accurately by only one index of either yellowness or lightness. Hereinafter is described why the thickness of the oxide film on the Cu core ball 1 cannot be managed by yellowness only.

Figure 2:
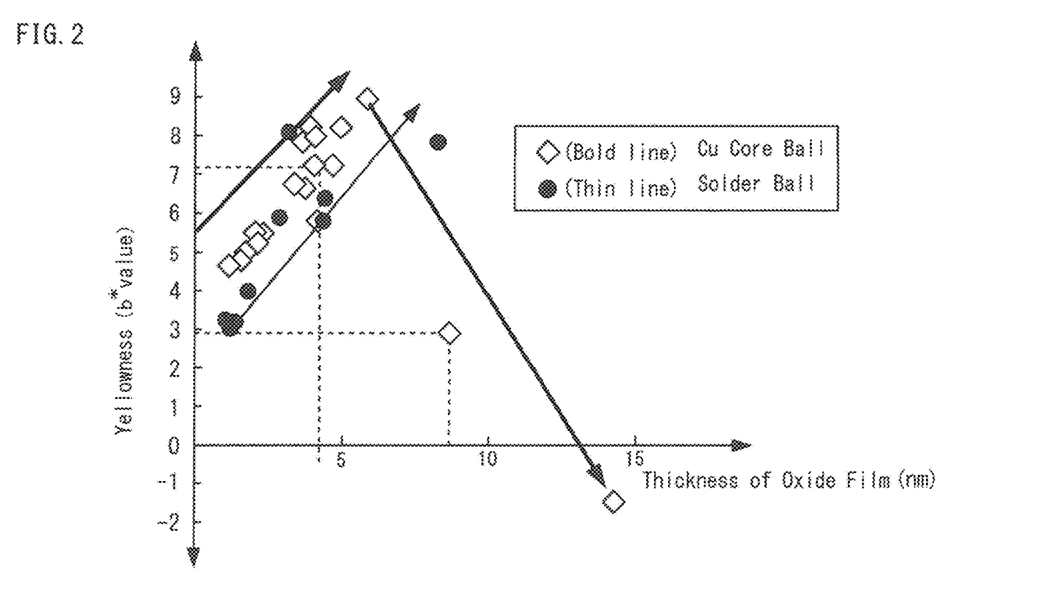
FIG. 2 is a graph of an oxide film thickness—yellowness relationship in a Cu core ball prior to a heating storage test.

FIG. 2 is a graph of an oxide film thickness—yellowness (b* value) relationship in the Cu core ball 1 and a solder ball. In the graph, a vertical axis indicates the yellowness and a horizontal axis indicates the oxide film thickness. As illustrated in FIG. 2, as for the solder ball, the thicker the oxide film thickness on the surface is, the more the yellowness rises. Thus, the yellowness and oxide film thickness of the solder ball are substantially in proportional relation to each other. Therefore, the oxide film thickness can be managed by the yellowness up to a certain thickness, in case of a solder ball.

Whereas, as for the Cu core ball 1, oxidation proceeds more rapidly than that for the solder ball and thereby the yellowness is increased. Afterwards, however, the yellowness is decreased regardless of the increase of the oxide film thickness. The relationship between the oxide film thickness and the yellowness is not proportional. For example, the oxide film thickness is 4 nm when the yellowness is 7.2, and the oxide film thickness is 8.7 nm when the yellowness is 2.9. Therefore, any correlation is not established between the oxide film thickness and the yellowness. It is conceivable that the impurities in solder plating coating the surface of the Cu ball account for this. Therefore, the index, yellowness, alone may be inadequate for accurate management of the oxide film thickness.

Figure 3:
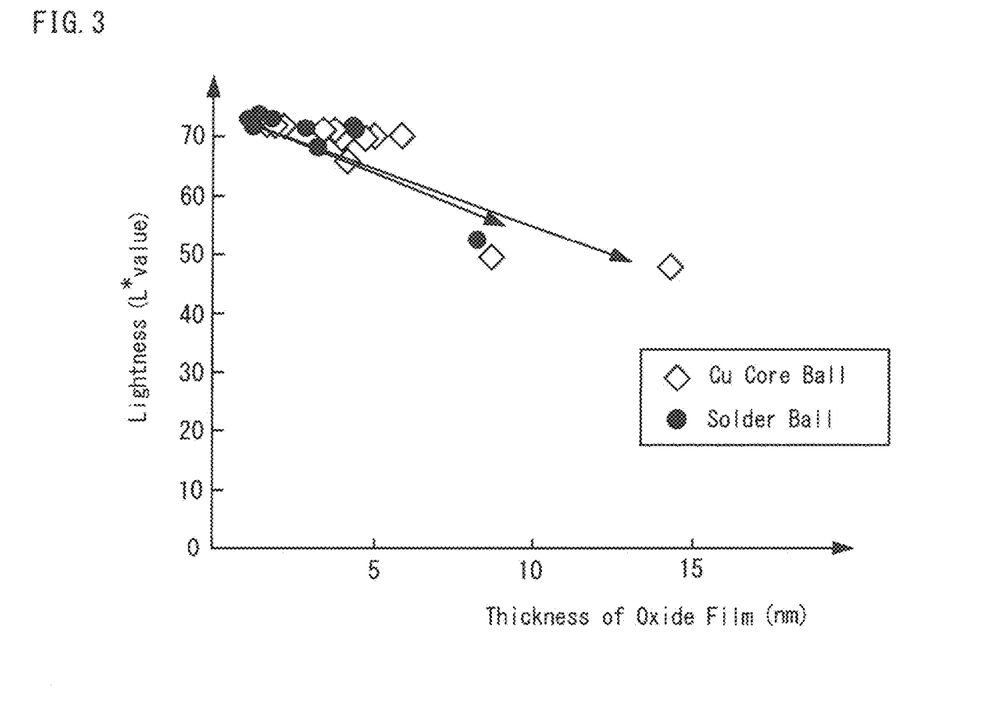
FIG. 3 is a graph of an oxide film thickness—lightness relationship in a Cu core ball prior to the heating storage test.

The following will describe a reason why the thickness of the oxide film on the Cu core ball 1 cannot be managed by lightness only. FIG. 3 is a graph of an oxide film thickness—lightness relationship in the Cu core ball 1 and a solder ball. In the graph, the vertical axis indicates the lightness and the horizontal axis indicates the thickness of oxide film. As illustrated in FIG. 3, the thickness of oxide film and the lightness of the Cu core ball 1 are correlated, where the thicker the thickness of oxide film is, the lower the lightness is. A correlation coefficient R of the thickness of oxide film and the lightness in this moment has been obtained. The correlation coefficient R is obtained from the range of −1 to 1. Subsequently, a coefficient of determination $R^2$ has been obtained by squaring the calculated correlation coefficient. The coefficient of determination $R^2$ is obtained from the range of 0 to 1, and it shows there is a correlation between the thickness of oxide film and lightness when it gets closer to 1.

The coefficient of determination $R^2$ of the thickness of oxide film and lightness of the Cu core ball 1 is 0.8229, which is a relatively small number below 1. Whereas, when a coefficient of determination of the thickness of oxide film and yellowness is obtained by the above-mentioned method, with the use of the values only before the yellowness's decreased shown in the FIG. 2, the coefficient of determination $R^2$ is 0.9523, which shows a value closer to 1, in managing by yellowness. Accordingly, the measured values vary widely in managing by lightness only, and thereby there is a problem that the thickness of oxide film cannot be managed with high accuracy. For this reason, in the present invention, the precise management of the thickness of the oxide film of a Cu core ball 1 prior to the heating storage test is conducted by using the both indexes of the lightness and the yellowness.

Cu Core Ball 1: Lightness and Yellowness Subsequent to Heating Storage Test

The Cu core ball 1 according to this invention has, subsequent to the heating storage test, lightness greater than or equal to 62.5 in the L*a*b* color space. The Cu core ball 1 is heated for 72 hours at 150° C. and with atmospheric humidity because the oxide film, which is formed in accordance with the amount of the plating solution residue after cleaning of the Cu core ball 1, may be formed in a short time without a long-term, for example, one-month long storage test. The lightness of the Cu core ball 1 is defined to be greater than or equal to 62.5, because the Cu core ball 1 having the oxide film thickness greater than a predetermined value (4.9 nm) over the heating storage test may be accurately identified and controlled. The lightness of the Cu core ball 1 in the L*a*b* color space may be greater than or equal to 70.2. This may allow for more strict management of the oxide film thickness. By meeting the two requirements, the Cu core ball 1 left with a reduced amount of the plating solution residue after cleaning and less likely to oxidize after long-term storage may be readily identified in a simplified manner.

Hereinafter are described the indexes used for thickness management of the oxide film on the Cu core ball 1 subsequent to the heating storage test. In the Cu core ball 1 subsequent to the heating storage test, one of the indexes, lightness, alone is used for thickness management of the oxide film because accurate control of the oxide film thickness may be possible with this index. Hereinafter is described why thickness management of the oxide film in the Cu core ball 1 may not be possible with the index, yellowness.

Figure 4:
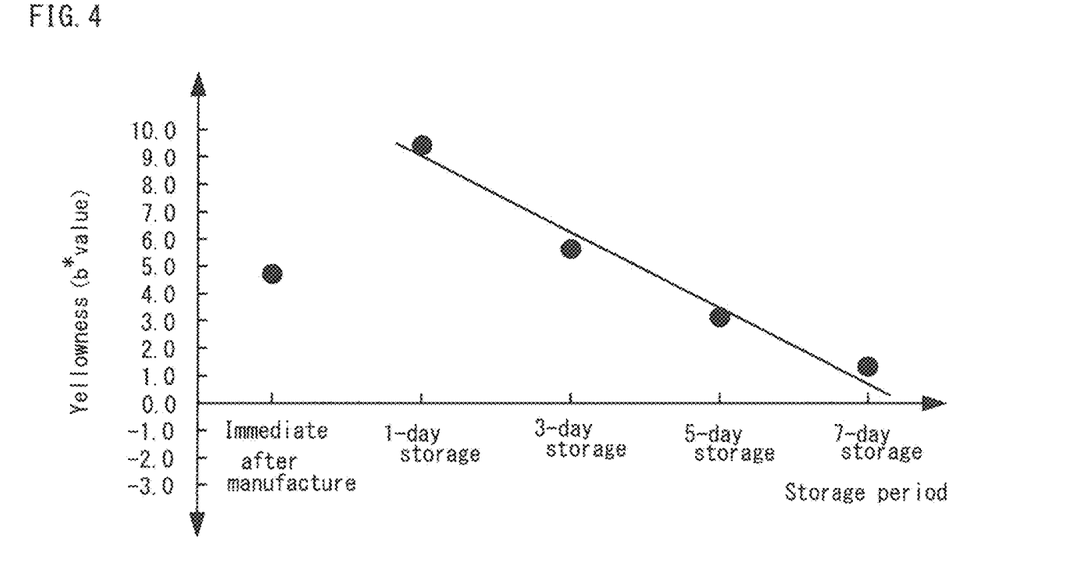
FIG. 4 is a graph of a storage period—yellowness relationship in a Cu core ball subsequent to the heating storage test.
Figure 5:
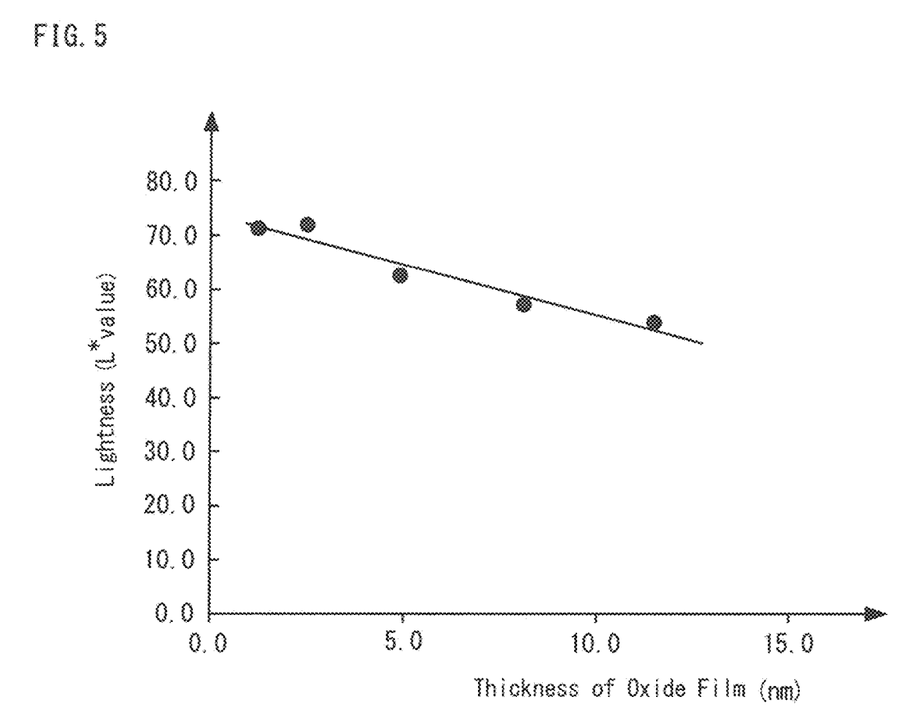
FIG. 5 is a graph of an oxide film thickness—lightness relationship in a Cu core ball subsequent to the heating storage test.

FIG. 4 is a graph of a storage period—yellowness relationship in the Cu core ball 1. In the graph, the vertical axis indicates the yellowness and the horizontal axis indicates the storage period. As for the Cu core ball 1, oxidation proceeds more rapidly than that for the conventional solder ball and thereby the yellowness is increased. Afterwards, however, the yellowness is decreased regardless of a prolonged storage period. The relationship between the yellowness and the storage period is not proportional. On and after one-day storage of the Cu core ball 1, The coefficient of determination $R^2$ of the yellowness and number of storage days is 0.589, which is significantly smaller than 1. Accordingly, the measured values vary widely in managing by yellowness, and thereby there is a problem that the thickness of oxide film cannot be managed with high accuracy.

Hereinafter is described why thickness management of the oxide film in the Cu core ball 1 may be possible with the index, lightness, alone. FIG. 4 is a graph of an oxide film thickness—lightness relationship in the Cu core ball 1. In the graph, the vertical axis indicates the lightness and the horizontal axis indicates the oxide film thickness. The thickness of oxide film and the lightness of the Cu core ball 1 are correlated, where the thicker the thickness of oxide film is, the lower the lightness is. The coefficient of determination $R^2$ of the lightness and oxide film thickness in the Cu core ball 1 is 0.9332, which shows a value closer to 1. Therefore, lightness-based management may reduce variability of the measured values, allowing for high accurate management of the oxide film thickness.

Prior to the heating storage test, the lightness-based management alone may result in more variable measured values, failing to manage the oxide film thickness of the Cu core ball 1 with high accuracy. After the heating storage test, on the other hand, the oxide film thickness of the Cu core ball 1 may be managed by the lightness alone with high accuracy. This is because of the reason described below. Tests performed prior to the heating storage test, which will be described later in further detail, are directed to the manufacture of a Cu core ball that may suppress any increase of the oxide film thickness by mounting the Cu core ball immediately after the manufacture in any various types of oxidation behaviors assumed under different test conditions including temperature, humidity, and heating time.

Whereas, since a Cu core ball that may suppress any increase of the oxide film thickness "subsequent to long-term storage" is assumed in the heating storage test according to this invention, a focus is placed on oxidation behaviors associated with high-temperature storage alone without the assumption of a number of different oxidation behaviors as in the tests prior to the heating storage test. The heating storage test according to this invention, which will be described later in further detail, is performed under uniform conditions including a heating temperature of 150° C. or more, except optionally changed heating time, to observe oxidation behaviors associated with high-temperature storage alone. Focusing on the oxidation behaviors associated with high-temperature storage alone, similar growth behaviors of the oxide film thickness may be observed. Similar growth behaviors of the oxide film thickness may lead to similar changes of the lightness, which indicates an improved correlation between the lightness and oxide film thickness. This invention, therefore, uses one index, lightness, to accurately manage the oxide film thickness of the Cu core ball 1 subsequent to the heating storage test.

[Cu Ball 2]

The Cu ball 2 constituting the Cu core ball 1 according to this invention is hereinafter described more in detail. The properties and other features of the Cu ball 2 remain unchanged before and after the heating storage test, a brief summary of which is given below. When the Cu core ball 1 is used for a solder bump, the Cu ball 2 is not meltable at soldering temperatures, serving to suppress the variability of a solder joint in height. Therefore, the Cu ball 2 may desirably be as spherical as possible and less variable in diameter.

Cu Ball 2: Composition

A composition of the Cu ball 2 may be a composition of a single Cu or an alloy composition whose main component is Cu. When the Cu ball 2 is composed of an alloy, a content of Cu is equal to or greater than 50 mass %. In addition, a ball to be cored may be composed of a single metal of Ni, Ag, Bi, Pb, Al, Sn, Fe, Zn, In, Ge, Sb, Co, Mn, Au, Si, Pt, Cr, La, Mo, Nb, Pd, Ti, Zr or Mg besides Cu, or an alloy, a metal oxide, or a mixed metal oxide.

Cu Ball 2: Purity

Although the purity of the Cu ball 2 is not specifically limited, it is preferably 99.9% or more, from a viewpoint of controlling the alpha dose as necessary and preventing electro-conductivity and/or thermal conductivity of the Cu ball 2 from being deteriorated because of less purity thereof. Examples of the impurities in the Cu ball 2 may include Sn, Sb, Bi, Ni, Zn, Fe, Al, As, Ag, In, Cd, Pb, Au, P, S, and Co.

Cu Ball 2: Sphericity

For the Cu ball 2, the sphericity is equal to or higher than 0.95, in terms of controlling stand-off height. If the sphericity of the Cu ball 2 is lower than 0.95, the Cu ball 2 becomes into an indeterminate shape. Therefore, bumps having uneven heights are formed at the bump formation time and the possibility that poor joints occur is increased. Moreover, when the Cu core ball 1 is mounted on an electrode and a reflow treatment is performed thereon, there may be a position gap of the Cu core ball 1 and a self-alignment property becomes worse. The sphericity is more preferably equal to or higher than 0.990. In the present invention, the sphericity represents a gap from a true sphere. The sphericity can be determined by various kinds of methods, for example, a least squares center method (LSC method), a minimum zone center method (MZC method), a maximum inscribed center method (MIC method), a minimum circumscribed center method (MCC method), etc. For details, the sphericity is an arithmetic mean value calculated by dividing a diameter of each of the 500 pieces of the Cu balls 2 by a length of the longest axis of each Cu ball 2. It is shown that when a value thereof is closer to the upper limit 1.00, this is closer to the true sphere. In this invention, the length of the diameter and the length of the longest axis are referred to as lengths measured by measuring equipment, ultra-quick vision, ULTRA QV 350-PRO manufactured by Mitsutoyo Corporation.

Cu Ball 2: Diameter

A diameter of the Cu ball 2 is preferably 1-1000 μm. If the diameter is within this range, the spherical Cu ball 2 can be stably manufactured. Moreover, a shorted connection can be suppressed when a pitch between the terminals is narrow.

Here, for example, if the diameter of the Cu core ball 1 according to the present invention is about 1-300 μm, a collection of 'Cu core balls' may be called as 'Cu core powder'. The 'Cu core powder' is the collection of many Cu core balls 1, each of which has the property as mentioned above. It is distinguished from a single Cu core ball 1 in usage form, such as it is mixed as the powder in solder paste, for example. Similarly, in a case that it is used for forming a solder bump, it is usually treated as a collection, and therefore the 'Cu core powder' used in such a form is distinguished from the single Cu core ball 1.

[Solder Layer 3]

The solder layer 3 constituting the Cu core ball 1 according to this invention is hereinafter described more in detail. The properties and other features of the solder layer 3 remain unchanged before and after the heating storage test, a brief summary of which is given below. When the Cu core ball 1 is used for a solder bump, the solder layer 3 is melted at reflow temperatures to serve as a joining material that electrically joins electrodes of a semiconductor package and of a printed circuit board.

Solder Layer 3: Composition

The composition of a solder layer 3 may be a composition of a single Sn, an alloy composition of the lead-free solder alloy whose main component is Sn, or a composition of a Sn—Pb solder alloy. When the solder layer 3 is composed of an alloy, a content of Sn is equal to or greater than 40 mass %. As an example of the composition of the lead-free solder, for example, Sn, Sn—Ag alloy, Sn—Cu alloy, Sn—Bi alloy, Sn—Ag—Cu alloy, Sn—In alloy and an alloy in which a predetermined alloy element is added to them are exemplified. An alloy element to be added may be, for example, Ag, Cu, In, Ni, Co, Sb, P, Fe, etc. As for an additive amount of alloy element to be added, it is preferable that the yellowness and lightness of lead-free solder alloy are reduced to almost the same degree as the yellowness and lightness of the single Sn. An alloy composition of the solder layer 3 is preferably Sn-3Ag-0.5Cu alloy among them, in terms of thermal fatigue life. A thickness of the solder layer 3 is not specifically limited: It is, for example, equal to or less than 100 μm (at each side thereof), which is sufficient. Generally, 20-50

μm at each side of the layer may be preferable. Moreover, a Sn content of the lead-free solder alloy whose main component is Sn according to the present invention is preferably equal to or more than 80%, and more preferably equal to or more than 90%.

Optionally, a layer for coating the Cu ball 2 made of one or more elements selected from Ni and Co, examples of which may include an Ni-plated layer and a Co-plated layer, may be interposed between the solder layer 3 and the surface of the Cu ball 2. This may reduce diffusion of Cu into the solder when joined to electrode, reducing the risk of copper leaching in the Cu ball 2. The Ni-plated layer or the Co-plated layer may have a thickness between 0.1 μm and 20 μm on one side. The Cu core ball 1 may have a flux-coated surface.

[Manufacturing Method for Cu Core Ball 1]

Next, the following will describe an example of a method of manufacturing the Cu core ball 1 according to this invention. First, a heat-resistant plate, like a ceramic plate, is prepared that has multiple semi-spherical dimples formed on the bottom. A diameter of the dimple and a depth thereof are suitably set according to a diameter of the Cu ball 2. For example, the diameter thereof is 0.8 mm and the depth thereof is 0.88 mm. Further, the Cu materials each having a chip shape (hereinafter, referred to as 'chip material'), which are obtained by cutting a fine wire made of Cu, are put into the dimples one by one in the heat-resisting plate.

Next, the heat-resisting plate in which the chip materials have been put into the dimples is heated at 1100-1300 degrees C. in the furnace into which reducing gas such as ammonia decomposition gas is filled and a heating process is performed thereon during 30 through 60 minutes. In this moment, when temperature in the furnace is more than the melting point of Cu, the chip material is fused so that it becomes sphered. Thereafter, the interior of the furnace is cooled and the Cu ball 2 is formed in each of the dimples of the heat-resisting plate. After being cooled, the formed Cu ball 2 is reheated at 800 through 1000 degrees C., which is the temperature lower than a melting point of Cu.

Further, as other methods, there are an atomizing method in which the fused Cu is dropped down from an orifice pierced in a bottom of a melting pot and the droplet is rapidly cooled to be sphered as the Cu ball 2 and a method in which thermal plasma heats cut material of Cu at a temperature of 1000 degrees C. or more to be sphered. Each of the Cu balls 2 sphered in such a way may be reheated at about 800 through 1000 degrees C. for 30 through 60 minutes. In addition, the Cu material as a raw material of the Cu ball 2 may be heated at 800 through 1000 degrees C. before the Cu ball 2 is sphered.

As the Cu material that is a raw material of the Cu ball 2, for example, pellet, wire, pillar and the like can be used. The Cu material may have purity of 99.9%-99.995% from a viewpoint such that the purity in the Cu ball 2 is not too low.

In a case of using a Cu material having the further high purity, the heating treatment mentioned above is not performed and a retention temperature of the fused Cu may be lowered to approximately 1000 degrees C. as in a conventional way. Thus, the above-mentioned heating treatment may be omitted or changed according to the purity in the Cu material.

As the method of forming the solder layer 3 on the Cu ball 2 by flowing the plating solution with the Cu balls 2 manufactured as described above, there are an electrolytic plating method such as a known barrel plating, a method of generating a high speed turbulent flow in the plating solution within a plating tank by a pump connected to the plating tank and forming the solder layer 3 on the Cu ball 2 by the turbulent flow in the plating solution, a method of providing a vibration plate in a plating tank to vibrate it at predetermined frequency so that the plating solution is agitated by high speed turbulent flow and forming the solder layer 3 on the Cu ball 2 by the turbulent flow in the plating solution and the like.

Next, the solder layer 3 (film thickness of a single side of which is 18 μm) of Sn—Ag—Cu after coating a Ni plating (film thickness of a single side of which is 2 μm) is formed on the Cu ball 2 having a diameter of 100 μm to form the Cu core ball 1 having a diameter of about 140 μm.

A Sn—Ag—Cu containing plating solution according to an embodiment of the invention contains a solvent mainly composed of water, sulfonic acids and metal components of Sn, Ag and Cu, as essential components.

The metal components are present in the plating solution as Sn ions ($Sn^{2+}$ and/or $Sn^{4+}$), Ag ions ($Ag^+$), and Cu ions ($Cu^+/Cu^{2+}$). The plating solution is obtained by mixing plating mother solution mainly composed of water and sulfonic acids with metallic compounds and preferably contains organic complex agent in order to stabilize the metal ions.

As the metallic compounds in the plating solution, the following ones are exemplified, for instance. As specific examples of the Sn compounds, tin salts of organic sulfonic acid such as methanesulfonic acid, ethanesulfonic acid, 2-propanol sulfonic acid, p-phenolsulfonic acid and the like and stannous compounds such as tin sulfate, tin oxide, tin nitrate, tin chloride, tin bromide, tin iodide, tin phosphate, tin pyrophosphate, tin acetate, tin formate, tin citrate, tin gluconate, tin tartrate, tin lactate, tin succinate, tin sulfamate, tin borofluoride, tin silicofluoride and the like are exemplified. A single species of these Sn compounds can be used or two species or more thereof can be mixed and used.

As the Cu compounds, copper salts of the above-mentioned organic sulfonic acid, copper sulfate, copper oxide, copper nitrate, copper chloride, copper bromide, copper iodide, copper phosphate, copper pyrophosphate, copper acetate, copper formate, copper citrate, copper gluconate, copper tartrate, copper lactate, copper succinate, copper sulfamate, copper borofluoride, copper silicofluoride and the like are exemplified. A single species of these Cu compounds can be used or two species or more thereof can be mixed and used.

As the Ag compounds, silver salts of the above-mentioned organic sulfonic acid, silver sulfate, silver oxide, silver chloride, silver nitrate, silver bromide, silver iodide, silver phosphate, silver pyrophosphate, silver acetate, silver formate, silver citrate, silver gluconate, silver tartrate, silver lactate, silver succinate, silver sulfamate, silver borofluoride, silver silicofluoride and the like are exemplified. A single species of these Ag compounds can be used or two species or more thereof can be mixed and used.

Further, when forming the solder layer 3 (film thickness of a single side of which is 20 μm) of Sn—Ag—Cu on the Cu ball 2 having a diameter of 100 μm, a quantity of electricity of about 0.0108 coulombs is required.

Blending quantities of respective metals in the plating solution are as follows: As $Sn^{2+}$, 0.21 through 2 mol/L, preferably 0.25 through 1 mol/L; As $Ag^+$, 0.01 through 0.1 mol/L, preferably 0.02 through 0.05 mol/L and as $Cu^{2+}$, 0.002 through 0.02 mol/L, preferably 0.003 through 0.01 mol/L. Here, since it is $Sn^{2+}$ that relates to the plating, a quantity of $Sn^{2+}$ may be adjusted in this invention.

Moreover, it is preferable that Ag ion concentration to Cu ion concentration (Ag/Cu molar ratio) is within a range of 4.5 through 5.58. If it stays within this range, it is possible to form the Sn—Ag—Cu based solder layer 3 such as Sn-3Ag-0.5Cu alloy that has a low melting point. Further, a desired deposition amount of solder plating is estimated according to a following formula (1) based on the Faraday's law of electrolysis and an amount of electricity therefor is calculated. The electric current flows through the plating solution so as to be the calculated amount of electricity and the plating is executed while the plating solution flows with the Cu balls 2. A volume of the plating tank may be fixed according to a total input amount of the Cu balls 2 and the plating solution.

$$w(g)=(I \times t \times M)/(Z \times F) \quad \text{Formula (1)}$$

In the formula (1), "w" is an electrolytic deposition amount (g); "I" is electric current (A); "t" is electricity energizing time (second); M is an atomic weight of a deposited element (in a case of Sn, 118.71); Z is an atomic value (in a case of Sn, bivalent); and F is the Faraday constant (96500 coulombs). The quantity of electricity Q (A*Sec.) is represented by I×t.

Although the plating has been executed in this invention while the plating solution flows with the Cu balls 2, a flowing method thereof is not particularly limited. For example, the plating solution may flow with the Cu balls 2 by a rotation of barrel like the barrel electrolytic plating method.

After the plating process is executed, any drying is executed in the air or under $N_2$ atmosphere, so that it is possible to obtain the Cu core ball 1 according to the invention.

As described earlier, when the solder plating is performed on the Cu ball 2, residue of the plating solution may be left on the surface of the Cu core ball 1. Cleaning is a conventional means to remove the plating solution residue left on the surface of the Cu core ball 1. Examples of a cleaning liquid used then may include pure water, organic solvents containing alcohol such as isopropyl alcohol and ketone (acetone), acidic cleaning liquids, for example, trisodium phosphate and basic cleaning liquids containing. Any one of these cleaning liquids may be singly used, or two or more of them may be combined and used.

Examples of cleaning methods employed then may include immersion cleaning, ultrasonic cleaning, spray cleaning, shower cleaning, jet cleaning, vacuum cleaning, degassing cleaning, barrel cleaning, brush oscillation cleaning, jet bubble cleaning, and micro-bubble cleaning and the like. Any one of these cleaning methods may be singly used, or two or more of them may be combined and used in accordance with a demanded cleaning effect. The amount of the plating solution residue left on the surface of the Cu core ball 1 and the degree of oxidation progress during storage may differ with the cleaning method, cleaning liquid, and cleaning time that are selected and used. Therefore, when sufficient cleaning is executed, it is possible to obtain the Cu core ball 1 which is less likely oxidize after long-term storage.

[Soldering Material: Another Example (1)]

In addition, a core constituting the Cu core balls 1 according to this invention can be composed of a resin ball. As resin materials, for example, amino resin, acrylic resin, ethylene-vinyl acetate copolymer, styrene butadiene block copolymer, polyester resin, melamine resin, phenol resin, alkyd resin, polyimide resin, urethane resin, epoxy resin, crosslinked resin are exemplified. It is preferable that especially electro-conductive plastic such as polyacetylene, polypyrrole, polythiophene, polyaniline or the like is used.

In a case of a core as the resin materials, a Cu core ball can be composed of a resin ball and a Sn—Ag—Cu based solder plating layer (covering layer) covering the surface of the resin ball. In addition, a kind or a layered structure of the covering layer mentioned above is not limited to the examples mentioned above.

[Soldering Material: Another Example (2)]

In the embodiment described so far, the degree of oxidation progress of the Cu core ball 1 is controlled based on the lightness and yellowness. This is, however, a non-limiting example. For example, the thickness of the oxide film formed on the surface of the Cu core ball may be directly controlled to determine the degree of oxidation progress of the Cu core ball after cleaning.

Another example of the Cu core ball according to this embodiment includes a Cu ball that provides a space between a semiconductor package and a printed circuit board, and a solder layer coating the Cu ball. In this Cu core ball, an oxide film thickness subsequent to the heating storage test performed for 72 hours with atmospheric humidity at 150° C. is less than or equal to 4.9 nm. By controlling the oxide film thickness subsequent to the heating storage test to stay at 4.9 nm or less, a Cu core ball sufficiently cleaned and less likely to oxidize (thin oxide film) may be identified and obtained. The oxide film thickness of the Cu core ball may be, more preferably, less than or equal to 3.1 nm. Any features of this Cu core ball substantially identical to the features of the above-mentioned Cu core ball 1 are not described herein again.

[Soldering Material: Another Example (3)]

In the embodiment described above, the soldering material has a ball-like shape. This invention is also applicable to a soldering material in the form of a column. Such a soldering material may include a cylindrical column, and a solder layer coating the surface of the cylindrical column. This soldering material has lightness greater than or equal to 62.5 in the L*a*b* color space subsequent to the heating storage test performed for 72 hours with atmospheric humidity at 150° C. Prior to the heating storage test, the soldering material has lightness greater than or equal to 65 in the L*a*b* color space and yellowness less than or equal to 7.0 in the L*a*b* color space.

The column may be made of a metal selected from Cu, Ni, Ag, Bi, Pb, Al, Sn, Fe, Zn, In, Ge, Sb, Co, Mn, Au, Si, Pt, Cr, La, Mo, Nb, Pd, Ti, Zr, and Mg, or an alloy, a metal oxide, or a mixed metal oxide of any one(s) of these metals, or a resin material. The composition of a solder layer may be a composition of a single Sn, an alloy composition of the lead-free solder alloy whose main component is Sn, or a composition of a Sn—Pb solder alloy. When the solder layer is composed of an alloy, a content of Sn is equal to or greater than 40 mass %. As an example of the composition of the lead-free solder, for example, Sn, Sn—Ag alloy, Sn—Cu alloy, Sn—Bi alloy, Sn—Ag—Cu alloy, Sn—In alloy and an alloy in which a predetermined alloy element is added to them are exemplified. An alloy element to be added may be, for example, Ag, Cu, In, Ni, Co, Sb, P, Fe, etc. Any other features of this soldering material but its shape (sphericity) are substantially identical to the above-mentioned Cu core ball 1, which are not described herein again.

The Cu core ball 1 according to this invention may be used to form a solder joint for electronic components. The solder joint described herein may refer to a structure in which a solder bump is mounted on electrode of a printed circuit board. The solder bump described herein may refer to a structure in which the Cu core ball 1 is mounted on electrode of a semiconductor chip.

[Executed Examples]

The following will describe executed examples of the invention, but the invention is not limited thereto.

Manufacturing of Cu Ball

Cu wires each having a purity of 99.995% or less were prepared. They were respectively put into the melting pot, the temperature of the melting pot was then risen to 1200 degrees C. and this heating treatment was performed during 45 minutes. Subsequently, the fused Cu was dropped down from an orifice pierced through a bottom of the melting pot and the dropped droplet was cooled so as to be manufactured as the Cu ball having a mean diameter of 100 μm.

Sphericity

The sphericity of the manufactured Cu ball was measured using CNC image measurement system. Specifically, the ultra quick vision, ULTRA QV350-PRO manufactured by MITSUTOYO Corporation was used. In the executed examples, a length of the longest axis and the diameter of the Cu ball were measured by the measuring equipment mentioned above, and the sphericity was obtained by calculating an arithmetic mean value which was calculated by dividing diameters of 500 Cu balls by their longest axes. It is shown that when a value thereof is closer to the upper limit of 1.00, this is closer to the true ball.

Cu Core Ball: Oxide Film Thickness, Lightness, and Yellowness Prior to Heating Storage Test Next, an Ni-plated layer of 2 μm in thickness (one side) was formed on the surface of each Cu ball of 100 μm in diameter to obtain an Ni-plated Cu ball of 104 μm in diameter. Then, a solder layer of 18 μm in thickness was formed on the surface of each Ni-plated layer to obtain a Cu core ball of 140 μm in diameter. The solder layer was made of an Sn-3 AG-0.5 Cu alloy. The obtained Cu core balls were put in a beaker filled with pure water and stirred with a stirrer for 10 minutes, and then cleaned. The oxide film thickness, lightness, and yellowness in the respective Cu core balls were measured under different conditions defined in the respective executed examples and comparison examples below.

In the executed example 1, the Cu core balls immediately after cleaning was used. In the executed example 2, each Cu core ball was stored in a normal temperature (air exposure) with the humidity of 30% through 40% for 2 days. In the executed example 3, each stirred and cleaned Cu core ball was stored in a normal temperature with the humidity of 30% through 40% for 5 days. In the executed example 4, each stirred and cleaned Cu core ball was stored in a normal temperature with the humidity of 30% through 40% for 7 days. In the executed example 5, each stirred and cleaned Cu core ball was stored in a normal temperature with the humidity of 30% through 40% for 10 days. In the executed example 6, each stirred and cleaned Cu core ball was stored in a normal temperature with the humidity of 30% through 40% for 14 days. In the executed example 7, each stirred and cleaned Cu core ball was stored in the temperature of 40 degrees C. with the humidity of 90% for 1 day. In the executed example 8, each stirred and cleaned Cu core ball was stored in a normal temperature with the humidity of 30% through 40% for 20 days. In the executed example 9, each stirred and cleaned Cu core ball was stored at the temperature of 40 degrees C. with the humidity of 90% for 2 days. In the executed example 10, each stirred and cleaned Cu core ball was stored at the temperature of 200 degrees C. for 1 hour. In addition, a normal temperature means 20 degrees C. through 30 degree C.

In the comparison example 1, each stirred and cleaned Cu core ball was stored at the temperature of 40 degrees C. with the humidity of 90% for 5 days. In the comparison example 2, each stirred and cleaned Cu core ball was stored at the temperature of 40 degrees C. with the humidity of 90% for 7 days. In the comparison example 3, each stirred and cleaned Cu core ball was stored at the temperature of 40 degrees C. with the humidity of 90% for 10 days. In the comparison example 4, each stirred and cleaned Cu core ball was stored at the temperature of 40 degrees C. with the humidity of 90% for 14 days. In the comparison example 5, each stirred and cleaned Cu core ball was stored at the temperature of 200 degrees C. for 1 day. In the comparison example 6, each stirred and cleaned Cu core ball was stored at the temperature of 200 degrees C. for 2 days.

Subsequently, each of the Cu core balls which had been stored under the conditions mentioned above in the executed examples 1 through 10 and the comparison examples 1 through 6 was collected and then lightness, yellowness, and thickness of oxide film of each of the collected Cu core balls were measured, respectively. The lightness and the yellowness of each of the Cu core balls were measured with the use of CM-2600d Spectrophotometer manufactured by Konica Minolta. The thickness of the oxide film of each of the Cu balls was measured by FE-AES of ULVAC PHI700. An acceleration voltage of the measuring apparatus was 10 kV and an irradiation current was 10 nA. The thickness of the oxide film (depth) was obtained by a speed of etching the surface of the sample with an Ar ion gun (etching rate), and an etching depth which was ½ peak value of oxygen-originated Intensity was used as an approximate value of the oxide film thickness. An etching rate is a $SiO_2$ conversion value obtained by converting a standard sample with etching speed. Table 1 shows a relationship among the lightness, yellowness and thickness of oxide film of the measured Cu core balls in each of the executed examples 1 through 10 and the comparison examples 1 through 6. In Table 1, a unit of the thickness of oxide film is (nm).

TABLE 1

| | Lightness | Yellowness | Oxide film thickness (nm) | Storage conditions (temperature/humidity/number of storage days) |
|---|---|---|---|---|
| Executed example 1 | 71.4 | 4.6 | 1.2 | Initial condition |
| Executed example 2 | 72.3 | 4.8 | 1.5 | Normal temperature/30-40%/2 days |
| Executed example 3 | 71.1 | 5.0 | 1.7 | Normal temperature/30-40%/5 days |
| Executed example 4 | 71.5 | 5.0 | 1.8 | Normal temperature/30-40%/7 days |
| Executed example 5 | 71.0 | 5.1 | 1.9 | Normal temperature/30-40%/10 days |
| Executed example 6 | 73.0 | 5.5 | 2.1 | Normal temperature/30-40%/14 days |
| Executed example 7 | 71.7 | 5.2 | 2.2 | 40° C./90%/1 day |
| Executed example 8 | 71.3 | 5.5 | 2.3 | Normal temperature/30-40%/20 days |

TABLE 1-continued

| | Lightness | Yellowness | Oxide film thickness (nm) | Storage conditions (temperature/humidity/number of storage days) |
|---|---|---|---|---|
| Executed example 9 | 71.1 | 6.8 | 3.4 | 40° C./90%/2 days |
| Executed example 10 | 63.1 | 6.5 | 3.4 | 200° C./1 hour |
| Comparison example 1 | 69.2 | 8.2 | 3.9 | 40° C./90%/5 days |
| Comparison example 2 | 69.1 | 7.2 | 4.1 | 40° C./90%/7 days |
| Comparison example 3 | 70.0 | 8.2 | 5.0 | 40° C./90%/10 days |
| Comparison example 4 | 69.7 | 8.9 | 5.9 | 40° C./90%/14 days |
| Comparison example 5 | 55.9 | −0.7 | 18.2 | 200° C./1 day |
| Comparison example 6 | 39.1 | −3.9 | 20.9 | 200° C./2 days |

As in the executed examples 1 to 10 of Table 1, the oxide film thickness was 3.8 nm or less in the Cu core balls having the lightness of 62.5 or more and the yellowness of 7.0 or less. As in the executed examples 1 to 5 of Table 1, the oxide film thickness was 1.9 nm in the Cu core balls having the yellowness of 5.1 or less and the lightness of 70 or more. This obtained Cu core balls each having a smaller oxide film thickness than those of the other executed examples 6 to 10.

On the other hand, as in the comparison examples 1 to 6, the oxide film thickness was 3.9 nm or more in the Cu core balls having the lightness of less than 62.5 and the yellowness of more than 7.0. This is greater than a target value of the oxide film thickness. It is known from the above results that the Cu core balls having a smaller oxide film thickness may be provided by selecting the core Cu balls having the lightness of 65 or more and the yellowness of 7.0 or less.

In addition, the redness (a* value) was also measured, however, it has been confirmed that the redness cannot be used as an index for managing the thickness of oxide film because the redness was smaller than the correlation coefficient with the thickness of oxide film and contribution ratio 1.

In addition, the alpha dose of each of the Cu core balls in the executed examples 1 through 10 was measured. However, although the result is not shown in the above-mentioned Tables, the alpha dose of each of the Cu core balls was equal to or less than 0.0010 cph/cm$^2$, which did not reach the required amount of 0.0200 cph/cm$^2$.

Cu Core Ball: Oxide Film Thickness, Lightness, and Yellowness Subsequent to Heating Storage Test The heating storage test was performed on the pre-test Cu core balls of the executed example 1 to quickly render the Cu core balls into a condition after long-term storage. Then, the oxide film thickness, lightness, and yellowness of the Cu core balls subsequent to the heating storage test were measured. The Cu core balls used then had been stirred and cleaned for 10 minutes, as mentioned above.

Cleaning Conditions and Conditions for Heating Storage Test

In an environment at 25° C. (room temperature) and with 40% humidity, a temperature-controlled bath was set to and kept at 150° C. for more than one hour. An executed example 1A cleaned again the Cu core balls, which had been stirred and cleaned, using a first cleaning method, and stored the cleaned Cu core balls in the temperature-controlled bath at 150° C. for three days. An executed example 1B cleaned again the Cu core balls, which had been stirred and cleaned, using a second cleaning method, and stored the cleaned Cu core balls in the temperature-controlled bath at 150° C. for three days. An executed example 1C cleaned again the Cu core balls, which had been stirred and cleaned, using a third cleaning method, and stored the cleaned Cu core balls in the temperature-controlled bath at 150° C. for three days. A comparison example 1A stored the Cu core balls, which had been stirred and cleaned, in the temperature-controlled bath at 150° C. for three days.

In the first cleaning method, the Cu core balls were put in a beaker filled with pure water, and the beaker containing the Cu core balls was set in an ultrasonic cleaner and subjected to ultrasonic cleaning for 10 seconds. In the second cleaning method, the Cu core balls were put in a beaker filled with pure water, and the beaker containing the Cu core balls was set in an ultrasonic cleaner and subjected to ultrasonic cleaning for 60 seconds. In the third cleaning method, the Cu core balls were put in a beaker filled with pure water, and the beaker containing the Cu core balls was set in an ultrasonic cleaner and subjected to ultrasonic cleaning for 180 seconds. In these executed examples, the first to third cleaning methods were ranked as methods of a high cleaning effect that may adequately remove residue of the plating solution. On the other hand, the stirring and cleaning alone were ranked as a method of a poor cleaning effect that may fail to adequately remove residue of the plating solution.

Subsequently, each of the Cu core balls which had been cleaned and heat-stored under the conditions mentioned above in the executed examples 1A, 1B, 1C and the comparison example 1A was collected and then lightness, yellowness, and thickness of oxide film of each of the collected Cu core balls were measured, respectively. The lightness and the yellowness of each of the Cu core balls were measured with the use of CM-2600d Spectrophotometer manufactured by Konica Minolta. The thickness of the oxide film of each of the Cu balls was measured by FE-AES of ULVAC PHI700. An acceleration voltage of the measuring apparatus was 10 kV and an irradiation current was 10 nA. The thickness of the oxide film (depth) was obtained by a speed of etching the surface of the sample with an Ar ion gun (etching rate), and an etching depth which was ½ peak value of oxygen-originated Intensity was used as an approximate value of the oxide film thickness. An etching rate is a $SiO_2$ conversion value obtained by converting a standard sample with etching speed. Table 2 shows a relationship among the lightness, yellowness and thickness of oxide film of the measured Cu core ball in each of the executed examples 1A, 1B, 1C and the comparison example 1A. In Table 2, a unit of the thickness of oxide film is (nm).

TABLE 2

| | Lightness | Yellowness | Oxide film thickness (nm) | Storage conditions (heating temperature/number of storage days) | Cleaning conditions |
|---|---|---|---|---|---|
| Executed example 1A | 62.5 | 5.6 | 4.9 | 150° C./3 days | Stirring and cleaning + ultrasonic cleaning for 10 sec. |
| Executed example 1B | 68.2 | 7.7 | 4.0 | 150° C./3 days | Stirring and cleaning + ultrasonic cleaning for 60 sec. |
| Executed example 1C | 70.2 | 6.9 | 3.1 | 150° C./3 days | Stirring and cleaning + ultrasonic cleaning for 180 sec. |
| Comparison example 1 | 59.8 | 4.8 | 6.1 | 150° C./3 days | Stirring and cleaning |

As in the executed examples 1A, 1B, and 1C of Table 2, ultrasonic cleaning was performed in addition to the stirring and cleaning. Then, after the heating storage test, the Cu core balls had the lightness of 62.5 or more and the oxide film thickness of 4.9 nm or less. This result teaches that, because of the correlation between the oxide film thickness and cleaning conditions of the Cu core ball, the Cu core balls less likely to oxidize after long-term storage (thin oxide film) may be identified and controlled by selecting (obtaining) the Cu core balls meeting the requirement of lightness, 62.5 or more, which is indicative of sufficient cleaning.

On the other hand, as in the comparison example 1A of Table 2, the stirring and cleaning alone resulted in the Cu core balls having the lightness of less than 62.5 and the oxide film thickness of more than 4.9 nm after the heating storage test. This result teaches that the Cu core balls having the lightness of less than 62.5 after the heating and storage, if selected, may be left with residue of the solder plating solution in rather abundance due to insufficient cleaning and likely to oxidize after long-term storage (thick oxide film).

In the above heating storage test, the Cu core balls of the executed example 1 in Table 1 have been used, which is a non-limiting example. The Cu core balls of the executed examples 2 to 10 in Table 1 were found to obtain similar effects to the Cu core balls of the executed example 1, though it is not shown in Table 1. Specifically, after the heating storage test, these Cu core balls had the lightness of 62.5 or more, and the oxide film thickness of 4.9 nm or less.

Next, Table 3 shows a relationship among the lightness, yellowness, and oxide film thickness in the Cu core balls immediately after cleaning before they were heated and stored. In Table 3, a unit of the thickness of oxide film is (nm).

TABLE 3

| | Lightness | Yellowness | Oxide film thickness (nm) | Storage conditions (heating temperature/number of storage days) | Cleaning conditions |
|---|---|---|---|---|---|
| Reference example 1 | 71.2 | 4.7 | 1.2 | Immediately after cleaning (initial) | Stirring and cleaning + ultrasonic cleaning for 10 sec. |
| Reference example 2 | 71.3 | 4.5 | 1.2 | Immediately after cleaning (initial) | Stirring and cleaning + ultrasonic cleaning for 60 sec. |
| Reference example 3 | 71.5 | 4.7 | 1.1 | Immediately after cleaning (initial) | Stirring and cleaning + ultrasonic cleaning for 180 sec. |
| Reference example 4 | 71.4 | 4.6 | 1.2 | Immediately after cleaning (initial) | Stirring and cleaning |

As in reference examples 1 to 4 of Table 3, the Cu core balls immediately after cleaning and before the heating storage test had the lightness of 71.2 or more and the oxide film thickness of 1.2 nm or less. Thus, the oxide film growth that depends on residue of the plating solution may not be facilitated immediately after cleaning and before the heating storage test, and values of the oxide film thickness may not be so different among the different cleaning conditions.

Next, Table 4 shows a relationship among the lightness, yellowness, and oxide film thickness in the Cu core balls subjected to the heating storage test at 150° C. for five days (120 hours). In Table 4, a unit of the thickness of oxide film is (nm).

TABLE 4

| | Lightness | Yellowness | Oxide film thickness (nm) | Storage conditions (heating temperature/number of storage days) | Cleaning conditions |
|---|---|---|---|---|---|
| Reference example 5 | 57.1 | 3.1 | 8.1 | 150° C./5 days | Stirring and cleaning + ultrasonic cleaning for 10 sec. |
| Reference example 6 | 60.7 | 4.7 | 6.1 | 150° C./5 days | Stirring and cleaning + ultrasonic cleaning for 60 sec. |
| Reference example 7 | 66.9 | 5.5 | 4.6 | 150° C./5 days | Stirring and cleaning + ultrasonic cleaning for 180 sec. |
| Reference example 8 | 49.6 | 2.9 | 8.7 | 150° C./5 days | Stirring and cleaning |

As in the reference examples 5 to 7 of Table 4, ultrasonic cleaning was performed in addition to the stirring and cleaning. Then, after the heating storage test, the Cu core balls had the lightness of 57.1 or more and the oxide film thickness of 8.1 nm or less. While, as in the reference example 8 of Table 4, the stirring and cleaning alone resulted in the Cu core balls 1 having the lightness of less than 57.1 and the oxide film thickness of more than 8.1 nm after the heating storage test.

Next, Table 5 shows a relationship among the lightness, yellowness, and oxide film thickness in the Cu core balls subjected to the heating storage test at 150° C. for seven days (168 hours). In Table 5, a unit of the thickness of oxide film is (nm).

TABLE 5

| | Lightness | Yellowness | Oxide film thickness (nm) | Storage conditions (heating temperature/number of storage days) | Cleaning conditions |
|---|---|---|---|---|---|
| Reference example 9 | 53.9 | 1.3 | 11.5 | 150° C./7 days | Stirring and cleaning + ultrasonic cleaning for 10 sec. |
| Reference example 10 | 56.8 | 3.6 | 10.3 | 150° C./7 days | Stirring and cleaning + ultrasonic cleaning for 60 sec. |
| Reference example 11 | 66.1 | 5.2 | 5.0 | 150° C./7 days | Stirring and cleaning + ultrasonic cleaning for 180 sec. |

TABLE 5-continued

| | Lightness | Yellowness | Oxide film thickness (nm) | Storage conditions (heating temperature/number of storage days) | Cleaning conditions |
|---|---|---|---|---|---|
| Reference example 12 | 48.1 | −1.5 | 14.3 | 150° C./7 days | Stirring and cleaning |

As in the reference examples 9 to 11 of Table 5, ultrasonic cleaning was performed in addition to the stirring and cleaning. Then, after the heating storage test, the Cu core balls had the lightness of 53.9 or more and the oxide film thickness of 11.5 nm or less. While, as in the reference example 12 of Table 5, the stirring and cleaning alone resulted in the Cu core balls 1 having the lightness of less than 53.9 and the oxide film thickness of more than 11.5 nm after the heating storage test.

In the executed examples and reference examples mentioned above, specific Cu core balls were chosen and used from a large number of Cu core balls obtained from the same batch process. The results with the Cu core balls of the executed examples and reference examples may be applicable to the other Cu core balls obtained from the same batch process for which the heating and storage were skipped.

This invention is not limited to the above-described embodiments as they are. The technical features and means thereof may be modified and specified without deviating from the scope of this invention in the execution phase. A suitable combination(s) of the technical features and means disclosed in the above-described embodiments may constitute variously different aspects of this invention.

DESCRIPTION OF CODES

1: Cu core ball (soldering material)
2: Cu ball (core)
3: Solder layer (covering layer)

The invention claimed is:

1. A soldering material comprising:
a spherical or cylindrical core that provides a space between a joining object and an object to be joined; and
a covering layer coating the core and comprising Sn or a solder alloy primarily including Sn, wherein the Sn content of the covering layer is equal to or greater than 90 mass %,
the soldering material having lightness greater than or equal to 62.5 in L*a*b* color space subsequent to a heating storage test performed for 72 hours in a temperature-controlled bath at 150° C. set in a room with a temperature of 25° C. and 40% humidity,
the soldering material, prior to the heating storage test, having lightness greater than or equal to 65 in the L*a*b* color space and yellowness less than or equal to 7.0 in the L*a*b* color space,
wherein the core is coated with a layer comprising one or more elements selected from the group consisting of Ni and Co, and is then coated with the covering layer.

2. The soldering material according to claim 1, wherein the lightness of the soldering material in the L*a*b* color space subsequent to the heating storage test is greater than or equal to 70.2.

3. The soldering material according to claim 1, wherein the core is a spherical material comprising at least one element selected from the group consisting of Cu, Ni, Ag, Bi, Pb, Al, Sn, Fe, Zn, In, Ge, Sb, Co, Mn, Au, Si, Pt, Cr, La, Mo, Nb, Pd, Ti, Zr, and Mg, or a resin material.

4. The soldering material according to claim 1, wherein the core is a cylindrical material comprising at least one element selected from the group consisting of Cu, Ni, Ag, Bi, Pb, Al, Sn, Fe, Zn, In, Ge, Sb, Co, Mn, Au, Si, Pt, Cr, La, Mo, Nb, Pd, Ti, Zr, and Mg, or a resin material.

5. A soldering material comprising:
a spherical core that provides a space between a joining object and an object to be joined, wherein the core comprises at least one element selected from the group consisting of Cu, Ni, Ag, Bi, Pb, Al, Sn, Fe, Zn, In, Ge, Sb, Co, Mn, Au, Si, Pt, Cr, La, Mo, Nb, Pd, Ti, Zr, and Mg, or a resin material; and
a covering layer coating the core and comprising Sn or a solder alloy primarily including Sn, wherein the Sn content of the covering layer is equal to or greater than 90 mass %,
the soldering material having lightness greater than or equal to 62.5 in L*a*b* color space subsequent to a heating storage test performed for 72 hours in a temperature-controlled bath at 150° C. set in a room with a temperature of 25° C. and 40% humidity,
the soldering material, prior to the heating storage test, having lightness greater than or equal to 65 in the L*a*b* color space and yellowness less than or equal to 7.0 in the L*a*b* color space.

6. The soldering material according to claim 5, wherein the core is coated with a layer comprising one or more elements selected from the group consisting of Ni and Co, and is then coated with the covering layer.

7. The soldering material according to claim 5, wherein the lightness of the soldering material in the L*a*b* color space subsequent to the heating storage test is greater than or equal to 70.2.

* * * * *